United States Patent [19]

Ceresara et al.

[11] 4,003,762
[45] Jan. 18, 1977

[54] PROCESS FOR THE PRODUCTION OF SUPERCONDUCTOR WIRES OR CABLES OF $Nb_3Al$ AND SUPERCONDUCTOR WIRES OR CABLES OBTAINED THEREBY

[76] Inventors: Sergio Ceresara, Via Magalotti 4, Novara; Giancarlo Sacerdoti, Via Montagne Rocciose 62, Rome; Nicola Sacchetti, Largo Ottavio Manilio 7, Frascati, all of Italy

[22] Filed: Mar. 17, 1975

[21] Appl. No.: 559,628

[30] Foreign Application Priority Data

Mar. 22, 1974 Italy .................. 49510/74

[52] U.S. Cl. .................. 148/11.5 R; 29/599
[51] Int. Cl.² .................. H01L 39/24
[58] Field of Search .................. 148/11.5 R; 29/599

[56] References Cited
UNITED STATES PATENTS

| | | |
|---|---|---|
| 3,570,118 | 3/1971 | Reynolds et al. .................. 29/599 |
| 3,625,662 | 12/1971 | Roberts et al. .................. 29/599 |
| 3,652,967 | 3/1972 | Tanaka et al. .................. 29/599 |
| 3,665,595 | 5/1972 | Tanaka et al. .................. 29/599 |
| 3,728,165 | 4/1973 | Howlett .................. 29/599 |
| 3,813,764 | 6/1974 | Tanaka et al. .................. 29/599 |
| 3,836,404 | 9/1974 | Strauss .................. 29/599 |
| 3,868,769 | 3/1975 | Dosdat et al. .................. 29/599 |

*Primary Examiner* — W. Stallard
*Attorney, Agent, or Firm* — Guido Modiano; Albert Josif

[57] ABSTRACT

A process for the production of superconductor wires or cables of $Nb_3Al$ which consists in superimposing sheets of Nb to sheets of Al, inserting the superimposed sheets in a copper container, subjecting the copper container with the sheets contained therein to a plastic deformation processing so as to obtain a reduction in the thickness of the Al sheet to a value of less than about 1.5 $\mu$m and finally subjecting this product to heat treatment at a temperature between 800° and 1000° C.

6 Claims, 1 Drawing Figure

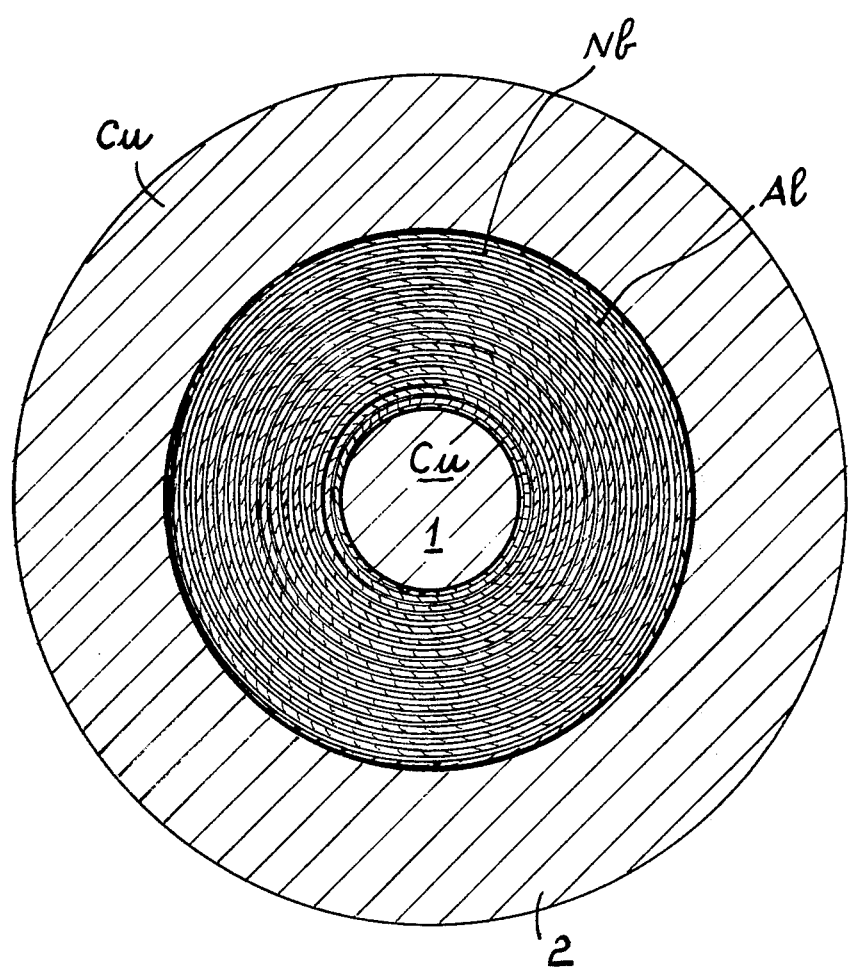

PROCESS FOR THE PRODUCTION OF SUPERCONDUCTOR WIRES OR CABLES OF $Nb_3Al$ AND SUPERCONDUCTOR WIRES OR CABLES OBTAINED THEREBY

BACKGROUND OF THE INVENTION

The present invention relates to a process for the production of superconductor wires or cables of $Nb_3Al$.

It is known that intermetallic compounds, having a generally defined crystalline structure of $\beta$ tungsten-type, or A 15, and belonging to the systems Nb-Al, Nb-Ge, Nb-Sn, or to particular ternary systems derived therefrom, are object of increasing attention as superconductor materials for high magnetic field applications.

It is also known that the compound $Nb_3Al$ is a superconductor material which has a high critical magnetic field and a high critical temperature.

It is moreover known that in order to produce a superconductor wire of $Nb_3Al$, by reacting at high temperature a strip of Nb coated with a layer of aluminium, similarly to what is known to be done for the production of superconductor wires of $Nb_3Sn$, until the intermetallic compound $Nb_3Al$ is obtained by interdiffusion, it is necessary to operate at reaction temperatures above 1200° C.

This high temperature is a disadvantage in the production of superconductor wires of $Nb_3Al$ with respect to the production of superconductor wires of $Nb_3Sn$ which requires a reaction temperature of only 700°–800° C.

SUMMARY OF THE INVENTION

An object of the present invention is to provide a process for obtaining the formation of the intermetallic compound $Nb_3Al$ at temperatures below 1000° C, comparable to the temperatures required for the formation of the intermetallic compound $Nb_3Sn$, and consequently to be able to produce superconductor wires of $Nb_3Al$ in conditions which are not disadvantageous with respect to those required for the production of superconductor wires of $Nb_3Sn$.

Another object of the present invention is to provide a process for producing superconductor wires and multifilament superconductor wires of $Nb_3Al$ stabilized in a copper matrix.

A further object of the present invention is to provide a process for the production of superconductor wires of $Nb_3Al$ embedded in a copper matrix, which can be carried out industrially in a simple and economical manner.

These and other objects, which will be more apparent to an expert in the art from the detailed description which will follows are advantageously attained by a process for the production of superconductor wires of $Nb_3Al$ which, according to the present invention consists in forming an assembly of superimposed sheets of Nb to sheets of Al, inserting said assembly of superimposed sheets in a copper container, subjecting said copper container with the sheets inserted therein to a plastic deformation processing so as to obtain a reduction in the thickness of the Al sheet to a value of less than about 1,5 $\mu$m and finally subjecting the product thus processed to heat treatment at a temperature between 800° and 1000° C. The superimposition of the sheets of Nb and Al is carried out by arranging a sheet of Al between two sheets of Nb so as to obtain a sandwich of the type Nb/Al/Nb or preferably a sandwich of the type Nb/Al/Nb/Al/Nb ... /Nb.

The shape of the copper container must be such as to mate with the assembly of sheets of Nb and Al inserted therein. It is pointed out that with the type of sandwiches described above, only the sheet of Nb must be in contact with the inner surface of the copper container; in fact direct aluminium / copper contact must be finally avoided in the practice of this invention.

In a preferred embodiment of the invention, said sandwiches are formed by superimposing a sheet of Nb on a sheet of Al and rolling up said superimposed sheets in the shape of a coil, which is then inserted in a cylindrical copper container.

Obviously instead of rolling up the pair Nb/Al, a sandwich of the type Nb/Al/Nb/Al/ ... /Al, may be rolled up in a coil.

In addition, with the process according to the invention, multifilament superconductor wires or cables may be produced. For this purpose, for example, a copper cylinder containing a coil of the combination Nb/Al is subject to plastic deformation working or processing to obtain a filament of a certain length: this filament is then cut into a number of sections, which are in turn assembled in a bundle in another copper container, which container is then subject to another plastic deformation working until a reduction in the thickness of the single Al sheets to a value of less than 1.5 $\mu$m is achieved submitting the product thus obtained to a suitable torsion so as to generate magnetic uncoupling of the single filaments, and finally submitting it to a heat treatment at a temperature between 800° and 1000° C.

In superconductor wires or cables of this invention, in which the wire or cable of $Nb_3Al$ are embedded in a copper matrix the copper acts as an alternative path for electric current in case a section of the superconductor wire of $Nb_3Al$ becomes locally resistive, thus avoiding an excessive heat production and favoring at least a partial stabilization of the cable in use.

As is known, multilfilament superconductor cables (with suitably torsioned filaments for magnetic uncoupling) represent the most advanced solution from the point of view of stabilizing the cable during use; however their production has until now been limited to ductile superconductors, such as Nb-Ti or Nb-Zr alloys, that is those which do not give rise to any particular problems in the plastic deformation processes related to their production. Since the compound $Nb_3Al$ has superconductive characteristics superior to the aforementioned alloys, the production, according to the present invention, of a multifilament cable with $Nb_3Al$ filaments stabilized with Cu, constitutes further technological progress with respect to prior art.

It has been surprisingly found that to form the phase $Nb_3Al$ at diffusion temperatures between 800° and 1000° C, in times comparable to those required for the formation of the compound $Nb_3Sn$, that is in at least ten minutes to a few hours, it is necessary that the thickness of the Al sheet, before the reaction, be less than about 1.5 $\mu$m; if the thickness is greater than 1.5 $\mu$m, operating at the same temperature, non-superconductive intermetallic compounds are also obtained (primarily with an increase in thickness).

The symbol $\mu$m indicates throughout the specification one millionth of a meter on one micrometer.

BRIEF DESCRIPTION OF THE DRAWINGS

The present invention will now be described in greater detail with reference to the accompanying drawing, given by way of example, in which the only FIGURE represents schematically in enlarged scale and in cross-section, a sheet of Nb and a sheet of Al superimposed and rolled in a coil on a copper core, said coil being inserted also in a copper container. For the sake of clarity the dimensions are out of proportion with respect to each other and the sheet of Al has not been hatched in cross-section.

DESCRIPTION OF A PREFERRED EMBODIMENT

With reference to the above mentioned drawing, a sheet of Al and a sheet of Nb of the same width but of greater length, are superimposed and then tightly wound in coil 1 consisting of a copper rod; thanks to the greater length of the Nb sheet, the winding is carried out in such a way that the copper rod is in direct contact with the contiguous Nb sheet and so that the external surface of the coil consists of the Nb sheet.

In this way direct contact is avoided between the superimposed Al sheet faces and the copper container in which the coil will be subsequently inserted.

If the cross-section of the coil is considered, as in the figure, the radial superimposition of the Nb and Al sheets will appear in a sandwich arrangement of the type Nb/Al/Nb/Al/Nb/ . . . /Nb.

Said coil, as represented in the figure, is inserted in a cylindrical container 2 made of Cu and the container with the inserted coil is thus submitted to plastic deformation working or processing, for example by wiredrawing, to obtain a wire or cable of desired dimensions.

If desired the container may be closed at one of its ends. This is particularly advantageous, when the plastic deformation is carried out by extrusion.

While the thickness of the Nb sheet is not critical, the thickness of the Al sheet is chosen so as to be less than 1.5 $\mu$m at the end of the plastic deformation working.

The wire is then subjected to a heat treatment at a temperature between 800° and 1000° C by means of which by interdiffusion between Nb and Al, the intermetallic superconductive compound $Nb_3Al$ is formed, thus obtaining a superconductor wire or cable made of $Nb_3Al$ embedded in a copper matrix.

The copper rod 1 may even be omitted; its use facilitates the coiling operation of the pair of sheets Nb/Al and the subsequent plastic deformation workings of the composite cylinder.

The type of plastic deformation working may be of a different kind, such as extrusion, rod rolling, swaging and so on.

For the production of multifilament superconductor wires, a plurality of elements similar to the one illustrated in the accompanying drawing may be assembled in a copper container and this composite structure is then subjected to plastic deformation working or processing to obtain a reduction in the thickness of the Al sheets to a value less than about 1.5 $\mu$m, and then subjecting it to a heat treatment at a temperature between 800° and 1000° C.

By way of illustration, an example of the practice of the process according to the invention is here given.

A sheet of Al having the following dimensions:

| | |
|---|---|
| length | 480 mm |
| width | 40 mm |
| thickness | 0.015 mm | was superimposed on a sheet of Nb having the following dimensions:

| | |
|---|---|
| length | 500 mm |
| width | 40 mm |
| thickness | 0.1 mm | the superimposition was carried out taking care that the aluminium sheet, of lesser length, should leave almost entirely uncovered the excess length of Nb sheet, that is about 20 mm.

The two sheets thus superimposed were rolled into a coil on a cylindrical copper core with 3 mm diameter, by starting the winding with the section of Nb sheet not covered by the aluminium sheet, so that the copper rod is in contact with the Nb and not with the Al.

The coil thus obtained, with a total diameter of 9 mm, and having an exterior surface consisting of Nb, was inserted in a cylindrical copper container, with an internal diameter of 9 mm and an external one of 14 mm.

The container with the inserted coil, substantially as represented in the accompanying figure, was subjected to rod rolling to form a rod of the dimensions 3 × 3 mm incross-section, the rod was subjected to swaging or hammering until a diameter of 1.66 mm was obtained and finally it was subjected to wiredrawing to obtain wire with a diameter of 0.2 mm. During the above mentioned plastic deformation working or processing cycle, conducted at room temperature, no intermediate annealing of the product were carried out.

However particular in case of greater initial diameters plastic deformation processing under heat may also be adopted. Anyhow the temperatures of such processing are always for lower than that of the subsequent heat treatment temperatures.

At the end of the plastic deformation working cycle, the thickness of the Al sheet was found to be about 0.21 $\mu$m, since the reduction ratio was about 70 to 1. The above indicated reduction ratio is given by the ratio between the initial diameter of the composite cylinder which is about 14 mm and that of the wire after the plastic deformation working, that is 0.2 mm. This ratio is in fact equal to 14/0.2 = 70/1. In addition to the samples of wire described above, that is samples of wire having a final diameter of 0.2 mm and having a thickness of the Al sheet of about 0.015/70 mm = 0.21 $\mu$m, samples were taken even during the above mentioned plastic deformation working cycle, and precisely samples having a diameter of 0.45 mm, 0.72 mm, 0.95 mm and 1.66 mm.

Keeping in mind the various reduction ratios in the sampling steps, which are respectively $$\frac{14}{0.45} = \frac{31}{1}, \frac{14}{0.72} = \frac{19.4}{1},$$

$$\frac{14}{0.95} = \frac{14.7}{1}, \frac{14}{1.66} = \frac{8.4}{1},$$

the corresponding thicknesses of Al sheet were

-continued $$\frac{0.015}{31} \text{ mm} = 0.48\mu\text{m}, \frac{0.015}{19.4} \text{ mm} = 0.77\mu\text{m},$$

$$\frac{0.015}{14.7} \text{ mm} = 1.02\mu\text{m}, \frac{0.015}{8.4} \text{ mm} = 1.78\mu\text{m}.$$

The different samples were subjected to heat treatment, in order to develop the intermetallic compound $Nb_3Al$, at a temperature between 800° and 1000° C for different lengths of time.

X-ray diffraction analysis of all the samples was made to identify the nature of the metallic phases present and then critical current measurements were taken at the temperature of 4.2° K, as a function of magnetic field up to 64,000 gauss.

The test data and results are listed in the following table.

| Sample No. | Wire Diameter (mm) | Thickness of the Al sheet ($\mu$m) | Temperature of the heat treatment (° C) | Time of heat Treatment (Hours) | Intermetallic phases present | Critical currents at 64 K gauss (A) |
|---|---|---|---|---|---|---|
| 1 | 0.2 | 0.21 | 950 | 0.5 | $Nb_3Al$ | 4.7 |
| 2 | 0.2 | 0.21 | 950 | 1 | $Nb_3Al$ | 4.4 |
| 3 | 0.2 | 0.21 | 850 | 0.5 | $Nb_3Al$ | 3.9 |
| 4 | 0.2 | 0.21 | 850 | 1.5 | $Nb_3Al$ | 4.8 |
| 5 | 0.45 | 0.48 | 950 | 1 | $Nb_3Al$ | 12.9 |
| 6 | 0.72 | 0.77 | 950 | 1 | $Nb_3Al$ | 10.7 |
| 7 | 0.72 | 0.77 | 950 | 2 | $Nb_3Al$ | 10.7 |
| 8 | 0.95 | 1.02 | 950 | 2 | $Nb_3Al$ | 10.1 |
| 9 | 1.66 | 1.78 | 950 | 2 | $Nb_2Al+Nb_3Al$ | 10.7 |

From a look at the table one may observe that if the thickness of the Al sheet, after the plastic deformation working, is less than 1.5 $\mu$m (samples from 1 to 8) the only phase $Nb_3Al$ appears, for reaction times up to 2 hours; if the thickness of the sheet is greater than 1.5 $\mu$m (sample No. 9) non-superconductor phases also appear (in the present case $Nb_2Al$).

The advantages of the present invention are evident from the preceding description, but they may be thus summarized.

With the process of the invention, it is possible to obtain superconductor wires or cables and multifilament superconductor wires or cables of $Nb_3Al$ at industrially acceptable temperatures. It is possible to obtain stabilized wires or cables in a copper matrix and embedded therein.

Modifications and variations may be made to the invention described and illustrated previously without falling outside its scope.

We claim:

1. A process for the production of superconductor wires of $Nb_3Al$ characterized in that it comprises forming at least one assembly of superimposed sheets of Nb and sheets of Al, inserting said assembly of superimposed sheets in at least one copper container so as to avoid direct contact between the superimposed Al sheet faces and the copper container, subjecting said copper container with the sheets inserted therein to a plastic deformation processing so as to obtain a reduction in the thickness of the Al sheet to a value of less than about 1.5 $\mu$m and finally subjecting the product thus processed to heat treatment at a temperature between 800° and 1000° C.

2. A process according to claim 1, characterized in that the assembly superimposed Nb and Al sheets is obtained arranging a sheet of Al between two sheets of Nb so as to obtain a sandwich of the type Nb/Al/Nb and preferably a sandwich of the type Nb/Al/Nb/Al/Nb . . . /Nb.

3. A process according to claim 2, characterized in that said sandwiches are made by superimposing a sheet of Al on a sheet of Nb and rolling said superimposed sheets in the shape of at least one coil.

4. A process according to claim 3, characterized in that said rolling up into a coil is carried out on a copper core, so as to avoid direct aluminum/copper contact.

5. A process for the production of superconductor wires made of $Nb_3Al$, according to claim 1 characterized in that it comprises superimposing a sheet of Nb to a sheet of Al, rolling up said superimposed sheets into a plurality of coils, preferably on a copper core so as to avoid direct aluminum / copper contact, inserting each coil in a copper container so as to avoid direct contact between the superimposed Al sheet faces and the copper container, assembling said containers in another copper container, subjecting this latter container to a plastic deformation working to obtain a reduction in the thickness of the Al sheet to a value of less than 1.5 $\mu$m, and finally subjecting the thus worked product to heat treatment at a temperature between 800° and 1000° C.

6. A process for the production of superconductor wires made of $Nb_3Al$ according to claim 1 characterized in that it comprises superimposing a sheet of Nb to a sheet of Al, rolling said superimposed sheets up in the shape of a coil, preferably on a copper core so as to avoid direct aluminum / copper contact, inserting said coil in a cylindrical copper container so as to avoid direct contact between the superimposed Al sheet faces and the copper container, subjecting said container to a plastic deformation working, subdividing the thus worked product into a plurality of sections, assembling said sections into another copper container, subjecting this latter container to a plastic deformation working to obtain a reduction of the thickness of the Al sheets to a value of less than about 1.5 $\mu$m and subjecting finally the product thus worked to heat treatment at a temperature between 800° and 1000° C.

* * * * *